(12) United States Patent
Chao et al.

(10) Patent No.: US 8,481,364 B2
(45) Date of Patent: Jul. 9, 2013

(54) FLEXIBLE MICRO-SYSTEM AND FABRICATION METHOD THEREOF

(75) Inventors: Tzu-Yuan Chao, Taoyuan County (TW); Chia-Wei Liang, Kaohsiung (TW); Yu-Ting Cheng, Hsinchu (TW)

(73) Assignee: National Chiao Tung University, Hsnichu (TW)

( * ) Notice: Subject to any disclaimer, the term of this patent is extended or adjusted under 35 U.S.C. 154(b) by 93 days.

(21) Appl. No.: 12/900,016

(22) Filed: Oct. 7, 2010

(65) Prior Publication Data

US 2012/0032320 A1   Feb. 9, 2012

(30) Foreign Application Priority Data

Aug. 6, 2010   (TW) ................................ 99126328 A

(51) Int. Cl.
*H01L 23/12*   (2006.01)
*H01L 21/302*   (2006.01)
*H01L 21/50*   (2006.01)

(52) U.S. Cl.
USPC ................... 438/106; 257/734; 257/E21.499; 257/E21.51; 257/E21.511; 438/115; 438/703

(58) Field of Classification Search
USPC ..................... 257/E21.499, E21.51, E21.511, 257/734; 438/106, 115, 703
See application file for complete search history.

(56) References Cited

U.S. PATENT DOCUMENTS

| | | | | |
|---|---|---|---|---|
| 4,927,505 | A | * | 5/1990 | Sharma et al. ................ 205/123 |
| 5,324,687 | A | * | 6/1994 | Wojnarowski ................ 438/107 |
| 2008/0009095 | A1 | * | 1/2008 | Charles et al. ................ 438/107 |
| 2008/0110477 | A1 | * | 5/2008 | Jung et al. ........................ 134/42 |

* cited by examiner

*Primary Examiner* — Peniel M Gumedzoe
(74) *Attorney, Agent, or Firm* — Rosenberg, Klein & Lee

(57) ABSTRACT

A fabrication method for integrating chip(s) onto a flexible substrate in forming a flexible micro-system. The method includes a low-temperature flip-chip and a wafer-level fabrication process. Using the low-temperature flip-chip technique, the chip is bonded metallically onto the flexible substrate. To separate the flexible substrate from the substrate, etching is used to remove the sacrificial layer underneath the flexible substrate. The instant disclosure applies standardized micro-fabrication process for integrating chip(s) onto the flexible substrate. Without using special materials or fabrication procedures, the instant disclosure offers a cost-effective fabrication method for flexible micro-systems.

15 Claims, 5 Drawing Sheets

FLEXIBLE MICRO-SYSTEM AND FABRICATION METHOD THEREOF

BACKGROUND OF THE INVENTION

1. Field of the Invention

The instant disclosure relates to a flexible micro-system and fabrication method thereof; in particular, a flexible micro-system and fabrication method thereof based on a wafer-level integration process of bonding chip(s) onto a flexible substrate.

2. Description of the Related Art

Flexible electronics has been a popular research topic in recent years. Flexible electronics is a technological breakthrough over the traditional solid silicon based electronics technology. In expanding the flexibility of the electronics, flexible electronics can be effectively applied in applications that require flexibility and space saving. Moreover, comparing to traditional silicon based electronics, flexible electronics enjoys the advantage of lower production cost.

Temperature is a critical factor in the fabrication process of the flexible electronic system. The entire operating temperature of the fabrication process must be lower than the glass transition temperature of the flexible substrate. Under the above constraint, conventional fabrication techniques such as SOL active layer transfer, ultra-thin chip embedding, and amorphous silicon transistor are developed for the fabrication of flexible electronics. However, these conventional fabrication processes are generally complex and expensive with low convertibility and product quality.

An alternative technology called "heterogeneous chip assembly scheme" uses solder balls or anisotropic conductive adhesives for chip integration to the flexible substrate. However, solder balls may leave gaps between the chip and the substrate. Moreover, the anisotropic conductive adhesive has very high electrical resistance, which has adverse effect on the high-frequency operation of the micro-system.

With the required temperature constraint, the attainment of a standardized fabrication process for flexible electronics is highly desirable.

Based on related research and experience, the inventor proposes the following solution to address the above issues.

SUMMARY OF THE INVENTION

The object of the instant disclosure is to provide a flexible micro-system and fabrication method thereof, based on a wafer-level fabrication process of chip(s) integration onto a flexible substrate under low temperature (temperature lower than the glass transition temperature of the flexible substrate). The fabrication method can be applied using the standard semiconductor fabrication process in saving production cost.

The second object of the instant disclosure is to provide a flexible micro-system and fabrication method thereof, where structural and electrical connection problems between the chip and the substrate are eliminated.

The third object of the instant disclosure is to provide a flexible micro-system and fabrication method thereof, where the bonding structure has excellent electrical properties for high-frequency applications.

To meet the above object, the instant disclosure provides a fabrication method of flexible micro-system, which comprises the steps of preparing a handle substrate; forming a sacrificial layer over the handle substrate; forming a flexible substrate over the sacrificial layer; forming a first conductive structure on the flexible substrate; providing at least one electronic component having a corresponding second conductive structure; bonding the first and the second conductive structure under low temperature to secure the electronic component onto the flexible substrate; and removing the sacrificial layer to separate the flexible substrate from the handle substrate, where the electronic component is anchored to the flexible substrate in forming the said flexible micro-system.

The instant disclosure further provides another fabrication method of flexible micro-system, which comprises the steps of preparing a handle substrate; forming a sacrificial layer on the substrate; forming a flexible substrate on the sacrificial layer; disposing at least one electronic component on the flexible substrate; and removing the sacrificial layer to release the flexible substrate from the handle substrate, where the electronic component and the flexible substrate forms the flexible micro-system.

To meet the above object, the instant disclosure provides a flexible micro-system, which comprises a flexible substrate and at least one electronic component. The electronic component is interconnected to the flexible substrate. The interconnection is formed by bonding the first conductive structure of the flexible substrate to the second conductive structure of the electronic component under low temperature.

The instant embodiments utilize a low-temperature flip-chip bonding technology and a wafer-level sacrificial release process for fabricating a flexible micro-system of integrated chips. In other words, the low-temperature flip-chip technology is applied for bonding any chips onto a flexible substrate. The flexible substrate is released from the wafer by etching the sacrificial layer below the flexible substrate. Such fabrication method can easily integrate different chips into a flexible electro micro-system. The material selection is not limited and standard semi-conductor fabrication process can be applied with low fabrication cost. Thereby, the fabrication method of the flexible electro/micro-system of the instant disclosure has significant industrial potential.

The instant disclosure has the following advantages. First, the instant disclosure utilizes the standard fabrication procedure of semi-conductors and micro electronics for fabricating flexible electro/micro-system. With no material restrictions, such fabrication method is flexible in meeting different needs and has low fabrication cost, which enhances the fabrication technology. Furthermore, with excellent boding properties, the flexible electro/micro-system of the instant disclosure can be widely used in high-frequency, bio-medical, flexible display, or solar cell module applications.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

The instant disclosure provides a flexible micro-system and fabrication method thereof. The fabrication method utilizes wafer-level fabrication processes, such as sacrificial release, flip-chip, or metal-to-metal thermal-compression bonding technique in fabricating flexible micro-systems at a set pace in controlling the fabrication cost.

Figure 1A:
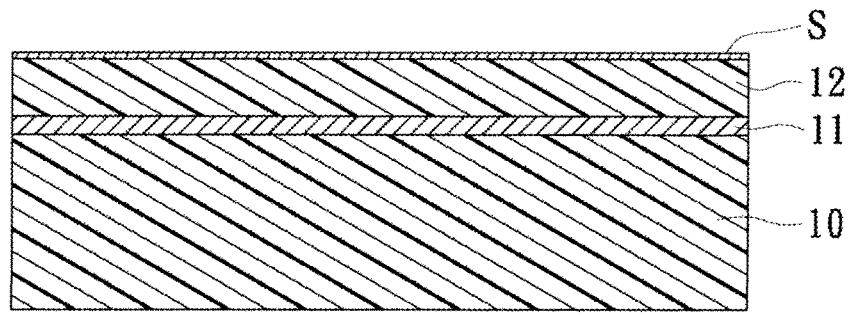
FIGS. 1A-1F show the fabrication process of the flexible micro-system of the instant disclosure.

Please refer to FIGS. 1A-1F and FIG. 2. The fabrication method of flexible micro-system of the instant disclosure comprises the steps of preparing a handle substrate 10 as shown in FIG. 1A. The handle substrate 10, such as a silicon wafer, is used as a temporary base for supporting the fabrication process. Next, a sacrificial layer 11 is formed on the handle substrate 10. The sacrificial layer 11 is used later for releasing the flexible micro-system from the handle substrate 10, The sacrificial layer 11 can have either single or multiple layers with no restrictions on material composition, However, the selected material for the sacrificial layer is removable by etching without damaging the layer or electronic component above the sacrificial layer. For the instant embodiment, chromium and copper layers of the sacrificial layer 11 are disposed onto the handle substrate 10 by sputter deposition, where the thickness of chromium and copper layer are 10 nm and 300 nm respectively.

Please refer to FIG. 1A, where the next step is forming a flexible substrate 12 onto the sacrificial layer 11. The flexible substrate 12 can be made of flexible, rollable, bendable, or stretchable materials. In the instant embodiment, spin coating procedure is used to apply a film of SU-8 photoresist onto the sacrificial layer 11 in forming the flexible substrate 12. The film thickness is approximately 26 um. Alternative procedures include using spin coating, physical vapor deposition, or chemical vapor deposition with selected film agent to form the flexible substrate 12. After the flexible substrate 12 of SU-8 is patterned, the next step is hard-baking. In the instant embodiment, the flexible substrate 12 of SU-8 is hard-backed at 200 C. for two hours. The goal is to allow the flexible substrate 12 to fully-cured in attaining higher glass transition temperature, or Tg. Also, the hard-baking process enhances the mechanical strength and chemical stability of the flexible substrate 12 for better stability during hot embossing, soldering, and chemical treatment in the later stage.

Figure 1B:
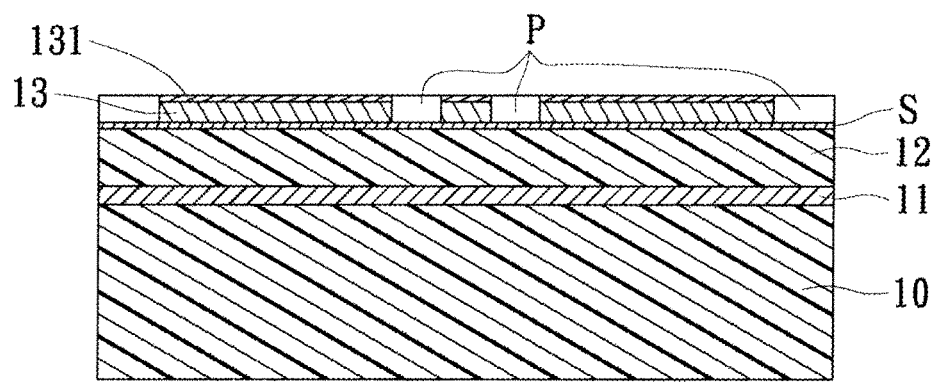
Figure 1C:
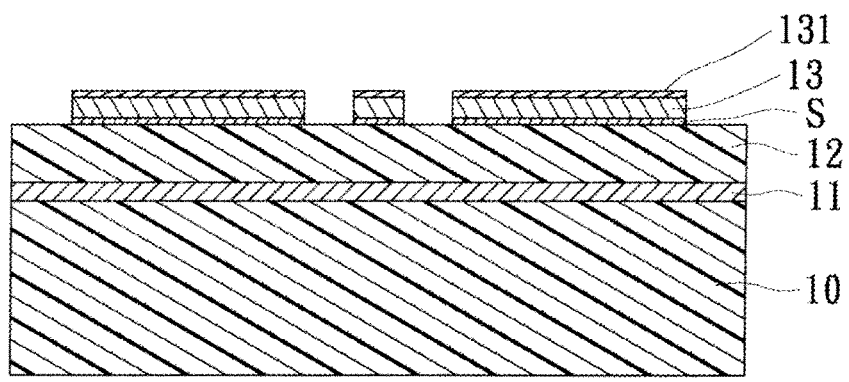

Next, a first conductive structure 13 is formed on the flexible substrate 12 as shown in FIG. 1B. Prior to forming the first conductive structure 13, a seeding layer S is first disposed over the flexible substrate 12 as shown in FIG. 1A. The purpose is to promote the nucleation of the first conductive structure 13. The seeding layer S can be composed of a titanium layer and a copper layer, with the thickness of 10 nm and 90 nm respectively. Afterwards, the first conductive structure 13 is disposed on the seeding layer S by electroplating. In the instant embodiment, the fabrication process for the first conductive structure 13 comprises the following steps. First, photolithography is used to dispose a patterned photoresist layer P on the seeding layer S. For example, a commercial photoresist called AZ 4620 is used to make a photoresist layer P of thickness 10 um to define the position of the first conductive structure 13. Next, copper plating is used to fabricate the first conductive structure 13 of a thickness 8 um, where the first conductive structure 13 can be a coplanar waveguide, CPW, for transmitting and receiving electric signals. Furthermore, the first conductive structure 13 can further form a first connecting layer 131. For example, electroless plating can be used to dispose a nickel layer and a gold layer on the first conductive layer 13, with a thickness of 1 um and 0.4 um respectively. The connecting layer 131 is to be used later during the bonding process at low temperature. Next, as shown in FIG. 1C, the photoresist layer P and the seeding layer S directly underneath are removed by standard microfabrication processes such as ACE, CR-7T, or BOE (Buffered Oxide Etch). Notably, the first conductive structure 13 can be a single or multiple layers, which can be adjusted accordingly during the fabrication process.

In another embodiment, after the formation of the first conductive structure 13 on the flexible substrate 12, a secondary flexible substrate is included (not shown). Specifically, the secondary flexible substrate is formed on the flexible substrate 12 with the first conductive structure 13 in between. The first conductive structure 13 is partially exposed for later use. Mainly for protection purpose, the secondary flexible substrate can use the same material as the flexible substrate 12 or use different material otherwise.

As of now, the flexible substrate 12 has formed the first conductive structure 13 and the first connecting layer 131 for connecting to the electronic component. Therefore, the following discussions explain the bonding process between the electronic component 20 and the flexible substrate 12.

Figure 1D:
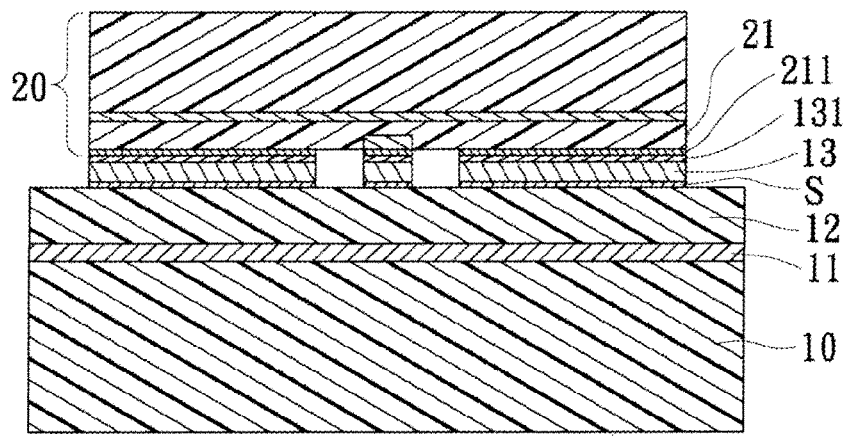

Please refer to FIG. 1D, which shows the electronic component 20 as any chip from the CMOS, MEMS, or III-V family. For explaining purpose but not limited to, the instant embodiment uses the RF chip from the CMOS technology. Corresponding to the first conductive structure 13, the contacting surface of the electronic component 20 has a second conductive structure 21. The surface of the second conductive structure 21 is a microstrip line composed of a nickel layer and a gold layer with a thickness of 0.2 um and 0.4 um respectively. In the instant embodiment, the coplanar waveguide and the microstrip have a width of 10.5 um with an impedance of 50 ohms. Therefore, the electronic component 20 is anchored onto the flexible substrate 12 by bonding the first connecting layer 131 of the first conductive structure 13 to the second conductive structure 21 at low temperature. For the instant embodiment, the bonding process between the first and second conductive structure comprises the following steps.

First, the connecting layer 131 of the first conductive structure 13 and the second conductive structure 21 undergo a surface treatment. For example, dry etching or wet etching is used to clean the connecting layer 131 of the first conductive structure 13 and the second conductive structure 21. In the instant embodiment, a liquid mixture of sulfuric acid ($H_2SO_4$) and hydrogen peroxide ($H_2O_2$) is used to clean the gold surface, also known as piranha cleaning process. Based on physical volume, the mixture ratio of sulfuric acid to hydrogen peroxide can be 3:1. The purpose is to increase the bonding strength between the connecting layer 131 of the first conductive structure 13 and the second conductive structure 21. The result of surface treatment is shown in Table 1 below:

TABLE 1

| Cleaning Time | Surface Composition (%) | | |
|---|---|---|---|
| (sec) | Carbon (C) | Oxygen (O) | Gold (Au) |
| 0 | 1.71 | 56.38 | 41.91 |
| 180 | 1.45 | 33.95 | 64.4 |

After performing the surface treatment, Table 1 shows the gold composition increased from 41.91% to 64.4% for the gold surface of the second conductive structure 21 and the first connecting layer 131. The ratio of carbon and oxygen composition decreased accordingly. As a result, the connecting layer 131 of the first conductive structure 13 can be bonded to the second conductive structure 21 more securely. On the other hand, the gold layer protects the layer underneath from damaging due to sulfuric acid and hydrogen peroxide, while the flexible substrate 12 of SU-8 has excellent chemical resistance.

Next, the flip-chip method is used to interconnect the electronic component 20. For example, a metal-to-metal thermal compression bonding technique is used to combine the first connecting layer 131 of the first conductive structure 13 and the second conductive structure 21. Specifically, a pressure of 100 MPa is applied for three minutes with an ambient temperature of 180 C. for bonding the first connecting layer 131 of the first conductive structure 13 to the second conductive structure 21 in forming an interconnected structure. The bonded structure can also transmit electric signals. Notably, the bonding process between the first connecting layer 131 of the first conductive structure 13 and the second conductive structure 21 is implemented under a low temperature environment. For example, the temperature of the metal-to-metal thermal compression bonding technique is lower than the glass transition temperature Tg of the flexible substrate 12, which prevents the coefficient of thermal expansion, or CTE, of the flexible substrate 12 from increasing or decreasing the mechanical strength thereof. Table 2 shows the relationship between the thermal compression bonding and the gold-to-gold specific contact resistance (SCR).

TABLE 2

| | Bonding Temp. (C). | | |
|---|---|---|---|
| | 160 | 200 | 240 |
| SCR ($10^{-7}$ Ω-$cm^2$) | 5.65 +/− 1.86 | 4.74 +/− 1.69 | 2.84 +/− 1.03 |

As shown in Table 2, even when the bonding temperature is reduced to 160 C., the SCR of the gold-to-gold surface is only at $(5.65+/-1.86) \times 10^{-7}$ Ω-$cm^2$.

In another embodiment, the initial surface treatment is skipped for bonding the first conductive structure 13 to the second conductive structure 21. The electronic component 20 is directly sent for low temperature flip chip process for interconnecting the first connecting layer 131 of the first conductive structure 13 to the second conductive structure 21 for bonding the electronic component 20 to the flexible substrate 12.

Figure 1E:
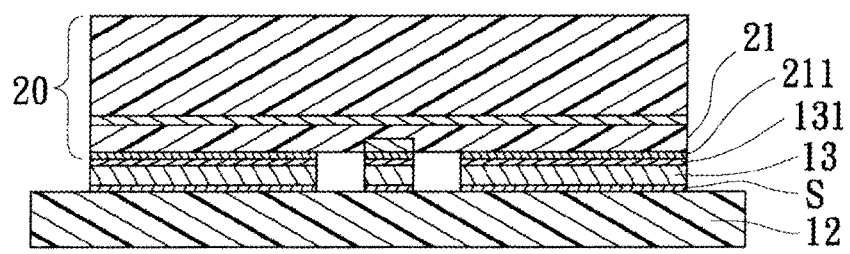
Figure 5:
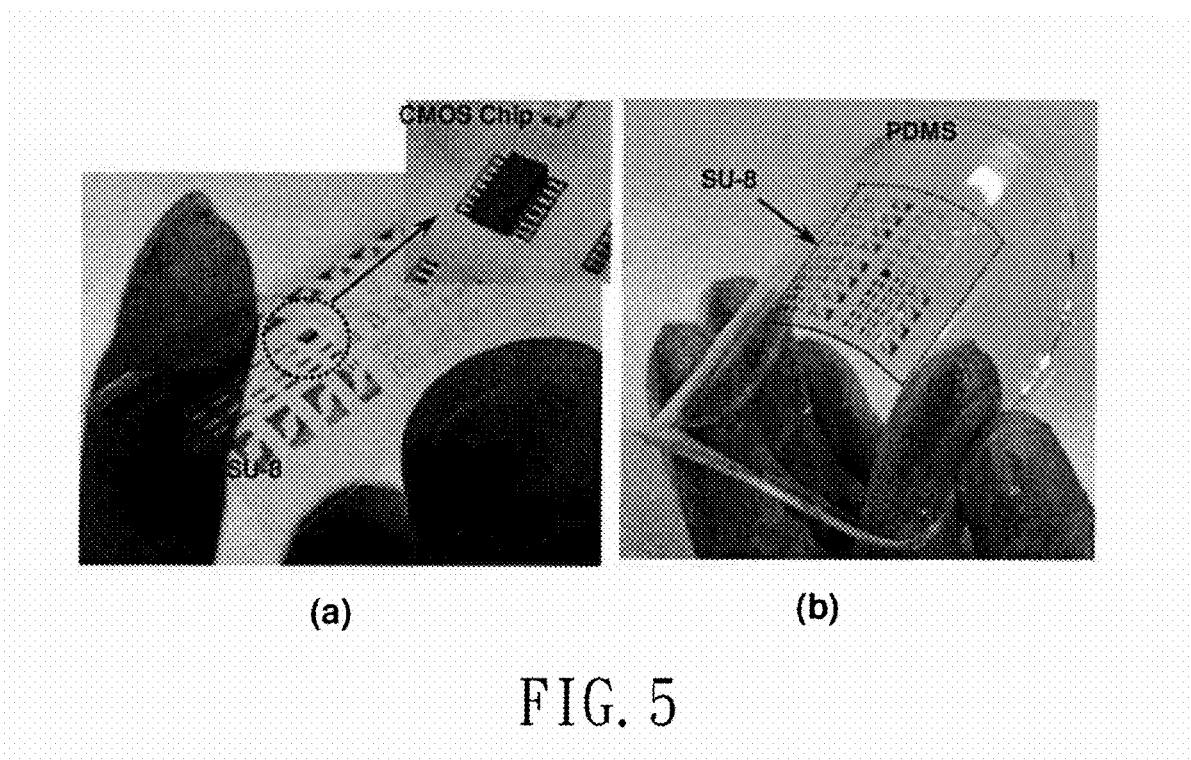
FIG. 5 shows two photos of a flexible micro-system of the instant disclosure.

FIG. 1E shows the next step of removing the sacrificial layer 11 to release the flexible substrate 12 from the substrate 10, where the electronic component 20 is secured onto the flexible substrate 12 in forming the said micro-system. in the instant embodiment, a copper etching solution is used to remove the chromium/copper layer of the sacrificial layer 11, with the etching solution having a ratio of ($H_2O:CH_3COOH:H_2O_2=100:5:5$). Thereby, the assembly of the flexible substrate 12 and the electronic component 20 is released off the substrate 10 in attaining a flexible micro-systerm. Please refer to FIG. 2A, where the first conductive structure 13 of the flexible substrate 12 forms a pair of coplanar waveguides 13A. Furthermore, the second conductive structure 21 of the electronic component 20 is made of aluminum, where double-zincate process can he utilized to dispose a zinc layer on the second conductive structure 21, and further dispose a nickel and gold layer over the zinc layer in forming the second connecting layer 211 as shown in FIG. 1D. The thickness of the nickel and gold layer is 0.2 um and 0.4 um respectively. With the second connecting layer 211, the electronic component 20 can be bonded to the flexible substrate 12 electrically during the flip-chip process. The microstrip formed by the second conductive structure 21 and the second. connecting layer 211 of the electronic component 20 is bonded to the coplanar waveguides 13A. The combination of the coplanar waveguides 13A and the microstrip provides electrical and structural connection. In other words, the instant disclosure utilizes a bonding process between the first conductive structure 13 and the second conductive structure 21 of the electronic component 20 at low temperature in attaining both electrical and structural interconnection. Lab test shows the gold-to-gold bonding strength can be greater than 6 MPa, which implies the electronic component 20 is securely bonded to the flexible substrate 12. The electronic component 20 also functions properly with other components such as sensors or actuators on the flexible substrate 12 in forming a flexible micro-system. FIG. 5A shows a picture of a fabricated micro-system of the instant disclosure.

Figure 2:
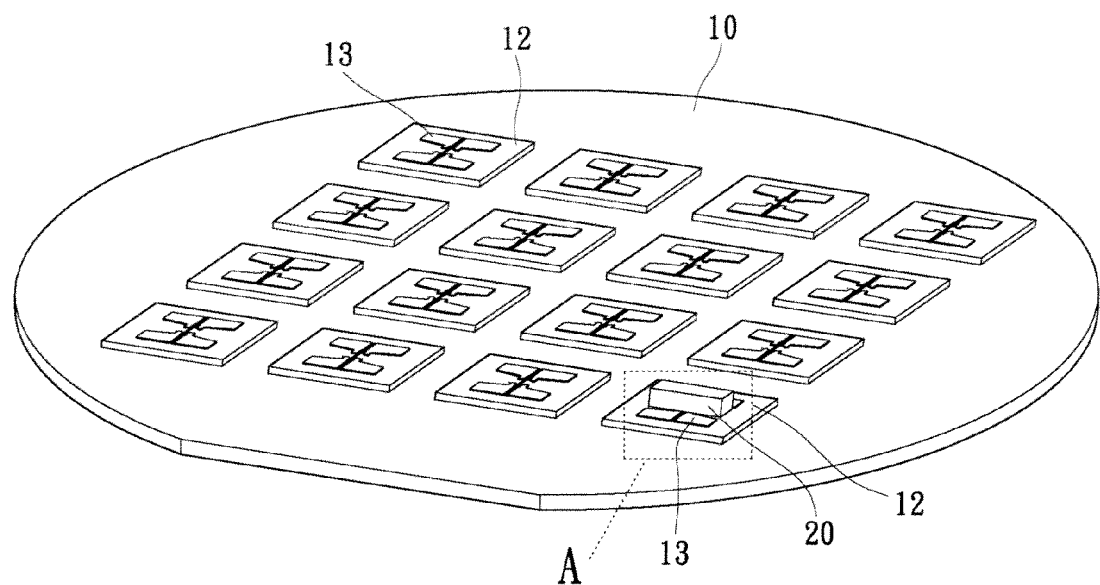
FIG. 2 shows a schematic view of using wafer-level fabrication process for fabricating flexible micro-systems.
Figure 2A:
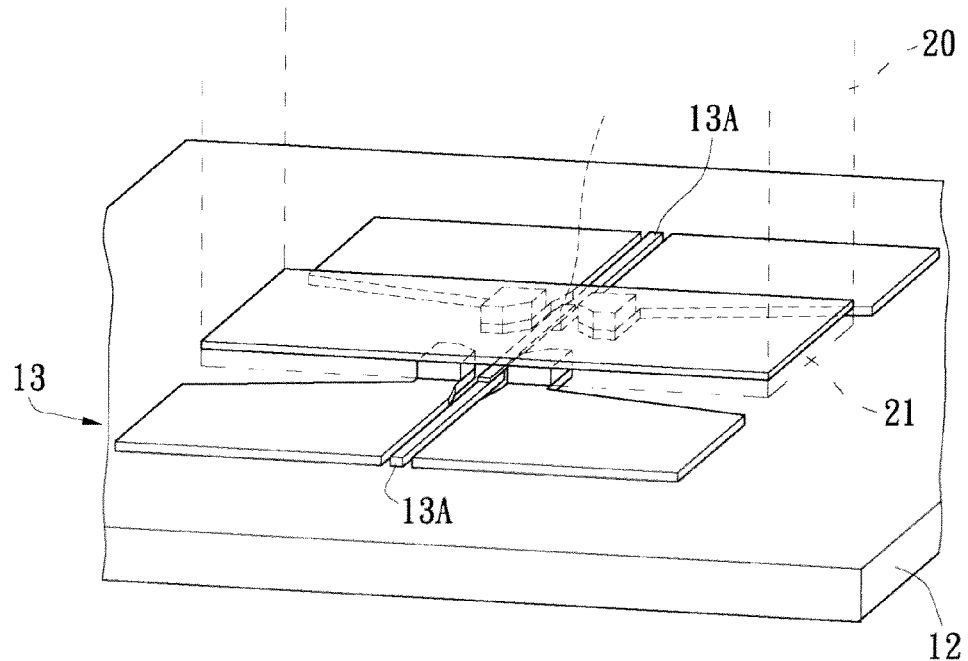
FIG. 2A shows a schematic view of a flexible micro-system of the instant disclosure.

Furthermore, the instant disclosure uses a wafer-level fabrication process. Therefore, a plurality of micro-systems can be fabricated on one wafer. As shown in FIG. 2, a plurality of flexible substrates 12 is disposed on the substrate 10. Based. on the above discussions, a first conductive structure 13 can be formed on each flexible substrate 12. Next, each flexible substrate 12 is bonded to an electronic component 20. By removing the sacrificial layer 11 as shown in FIG. 1E, a plurality of flexible micro-systems is attained.

Figure 1F:
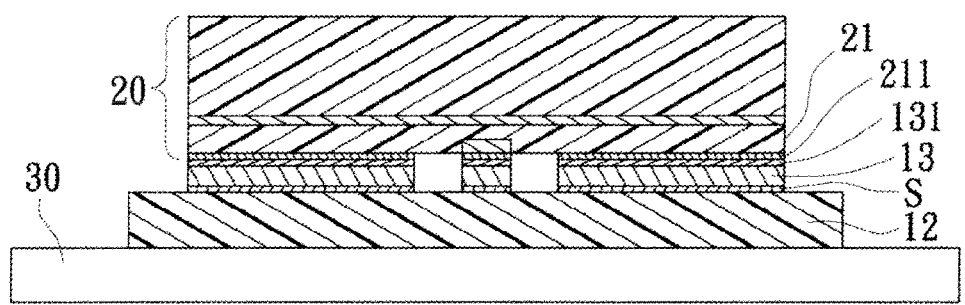

Please refer to FIG. 1F, where the flexible micro-system can be anchored to a flexible supporting substrate 30, such as Sylgard 184 composed of polydimethylsiloxane (PDMS), for reinforcing the overall structural strength. FIG. 5b shows a picture of a flexible micro-system anchored to a PDMS support of the instant disclosure.

Figure 3:
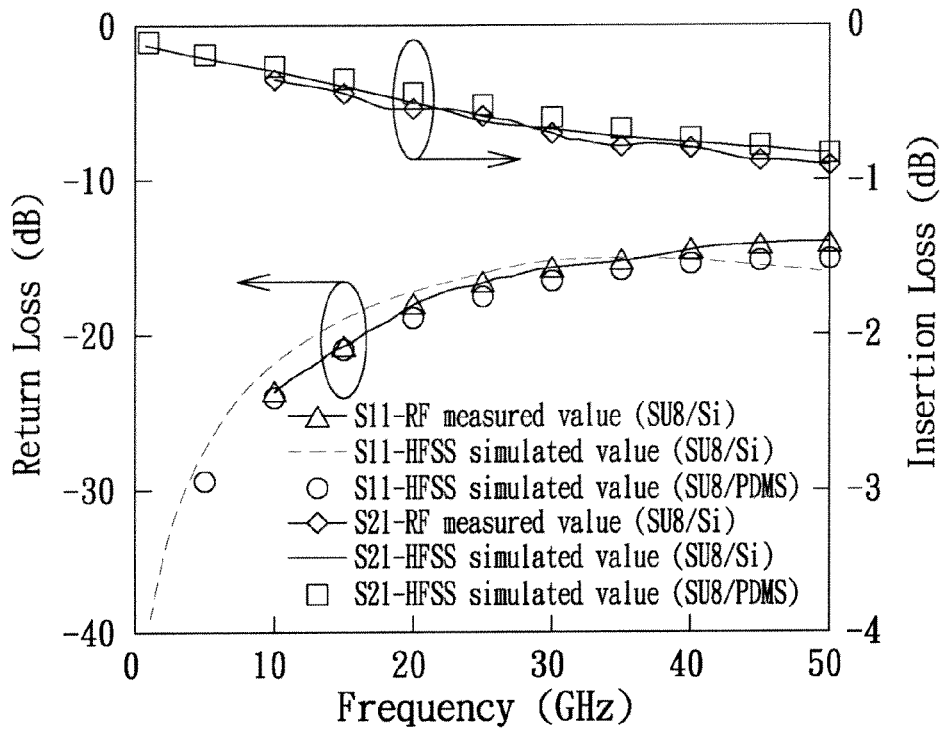
FIG. 3 shows S11 and S21 measurement results of a flexible micro-system of the instant disclosure.

In addition, lab test is conducted regarding the S-parameters of the signal transition structure composed of the coplanar waveguides 13A and the micro-strip, or called MS-CPW, at a frequency of 10 to 50 GHz. To ensure accuracy, the test is performed by including the substrate 10 or the PDMS. FIG. 3 shows the test measurement results under different conditions with S11 and S21 curves. As shown in FIG. 3, for under 40 GHz, the return loss is better than −15 dB and the insertion loss is less than −0.8 dB. In addition, the RF value is very close to the simulated HFSS curve. On the other hand, the return loss of the tested MS-CPW structure is close to a pure gold material, which has excellent signal transmission properties. In the instant disclosure, the impedance can be adjusted to improve the return loss value. On the other hand. FIG. 3 shows no significant difference regarding the RF characteristics between the MS-CPW structures placed on the substrate 10 versus the PDMS. The possible reason is because the flexible substrate 12 of SU-8 has enough thickness in offsetting the effect from the sacrificial layer 11.

Figure 4:
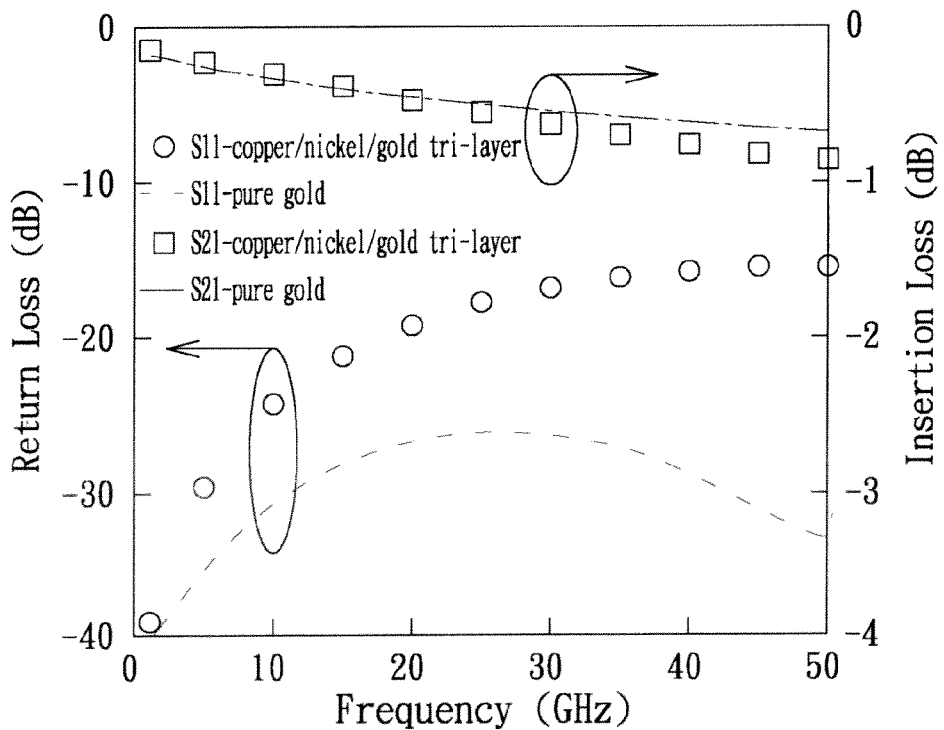
FIG. 4 shows S11 and S21 measurement results of different types of bonding material of a flexible micro-system of the instant disclosure.

FIG. 4 shows the test results of using different fabrication materials for the coplanar waveguides 13A on the SU-8/PDMS. The compared material includes copper (8 um), nickel (1 um), gold alloy (0.4 um), and pure gold (9.4 um). The MS-CPW structure of pure gold has a small insertion loss up to −0.59 dB. Therefore, different materials can be selected for the coplanar waveguides to achieve required high frequency characteristics. Also, the bonding and structural dimension can be adjusted accordingly to satisfy the wireless application of the flexible micro-system. In the instant embodiment, the bonding width is approximately 10.5 um.

In summary, based on the embodiment of the instant disclosure, a flexible micro-system is fabricated, which comprises a flexible substrate 12 and at least one electronic component 20. By bonding the first conductive structure 13 of the flexible substrate 12 to the second conductive structure 21 of the electronic component 20 at low temperature, the electronic component 20 is interconnected to the flexible substrate 12. The interconnection ensures the electronic component 20 is mounted securely to the flexible substrate 12 for dispatching or transmitting electric signals.

On the other hand, the instant disclosure provides the second embodiment for the fabrication method of flexible microsystem. In the second embodiment, the electronic component 20 is directly disposed on the flexible substrate 12, which differs from the first embodiment. In other words, the second embodiment comprises the following steps:

Step 1: Preparing a substrate 10;
Step 2: Forming a sacrificial layer 11 on the substrate 10;
Step 3: Forming a flexible substrate 12 on the sacrificial layer 11;
Step 4: Disposing an electronic component 20 directly to the flexible substrate 12;
Step 5: Removing the sacrificial layer 11 by wet or dry etching technique, which releases the flexible substrate 12 from the substrate 10 in attaining the flexible micro-system.

Details regarding the fabrication method of the second embodiment can be referred from earlier discussions regarding the first embodiment. Also, the second embodiment utilizes the wafer-level fabrication process. Therefore, a plurality of flexible micro-systems can be fabricated on a wafer. As shown in FIG. 2, the substrate 10 has a plurality of flexible substrates 12. Based on the above steps, each flexible substrate 12 can host at least one electronic component 20. Finally, the sacrificial layer 11 is removed as illustrated in FIGS. 1D and 1E in attaining multiple flexible micro-systems.

Overall, the instant disclosure has the following advantages:
1. The instant disclosure applies wafer-level fabrication technique for bonding chip(s) to the flexible substrate at low temperature. By using the standard industrial fabrication procedure, the instant fabrication method saves cost.
2. The assembly of the chip(s) and the flexible substrate of the instant disclosure has excellent signal transmitting properties favorable for high frequency applications.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A method for fabricating a flexible micro-system, comprising the steps of:
   providing a handle substrate;
   forming a sacrificial layer on the handle substrate;
   forming a flexible substrate on the sacrificial layer, the flexible substrate having a glass transition temperature value;
   forming a first conductive structure on the flexible substrate;
   providing at least one electronic component having a second conductive structure opposing the first conductive structure;
   pressing together substantially planar outer surfaces of the first conductive structure and the second conductive structure at a predetermined pressure and temperature for a predetermined time duration to form a direct substantially planar bond therebetween, the electronic component being thereby fixed in an electrically conductive manner to the flexible substrate, wherein the predetermined temperature remains lower than the glass transition temperature value of the flexible substrate; and
   chemically removing the sacrificial layer to release the flexible substrate from the handle substrate, whereby the electronic component is bonded to the flexible substrate in forming a flexible micro-system.

2. The method for fabricating a flexible micro-system of claim 1, wherein the step of forming the first conductive structure on the flexible substrate further comprises the step of forming a first connecting layer on the first conductive structure.

3. The method for fabricating a flexible micro-system of claim 2, wherein the step of pressing the first conductive structure with the second conductive structure further comprises the steps of:
   performing a surface treatment of the first connecting layer of the first conductive structure and an opposing surface of the second conductive structure; and
   applying a low-temperature flip-chip process for interconnecting the first connecting layer of the first conductive structure with the opposing surface of the second conductive structure.

4. The method for fabricating a flexible micro-system of claim 3, wherein the low-temperature flip-chip process includes a thermal compression bonding process, wherein the thermal compression bonding process is executed at a temperature lower than the glass transition temperature of the flexible substrate.

5. The method for fabricating a flexible micro-system of claim 3, wherein the surface treatment process includes applying an etching technique to clean the first connecting surface of the first conductive structure and the opposing surface of second conductive structure, the opposing surface of the second conductive structure including a second connecting layer formed thereon.

6. The method for fabricating a flexible micro-system of claim 2, wherein the step of bonding the first conductive structure with the second conductive structure at low temperature further comprises the step of:
   performing low-temperature flip-chip process for the electronic component for bonding the first connecting layer of the first conductive structure to the second conductive structure.

7. The method for fabricating a flexible micro-system of claim 1, wherein the removal of the sacrificial layer includes a chemical dry etching process or a wet etching process.

8. The method for fabricating a flexible micro-systems of claim 1, further comprising the step of mounting the flexible micro-system on a flexible supporting substrate.

9. The method for fabricating a flexible micro-system of claim 1, further comprising a step of forming a secondary flexible substrate partially covering the first conductive structure after the step of forming the first conductive structure on the flexible substrate.

10. The method for fabricating a flexible micro-system of claim 1, wherein removal of the sacrificial layer includes applying a copper etching solution, wherein the first conductive structure and the second conductive structure each comprise gold, and wherein the pressing of the first conductive structure and the second conductive structure causes the gold of the first conductive structure and the second conductive structure to interconnect with one another.

11. The method for fabricating a flexible micro-system of claim 10, wherein before the pressing of the first conductive structure and the second conductive structure, a liquid mixture of a sulfuric acid ($H_2SO_4$) and a hydrogen peroxide ($H_2O_2$) is applied to remove carbon and oxygen from respective surfaces of the first conductive structure and the second conductive structure for increasing the gold ratio thereof.

12. The method for fabricating a flexible micro-system of claim 11, wherein the mixture ratio of the sulfuric acid ($H_2SO_4$) to the hydrogen peroxide ($H_2O_2$) is approximately 3:1 based on physical volume.

13. The method for fabricating a flexible micro-system of claim 11, wherein the predetermined pressure is approximately 100 MPa, the predetermined temperature is approximately 180° C., and the predetermined time is approximately 180 seconds.

14. The method for fabricating a flexible micro-system of claim 10, wherein the copper etching solution includes $H_2O$, $CH_3COOH$, and $H_2O_2$ components, and the ratio of $H_2O$:$CH_3COOH$:$H_2O_2$ of the copper etching solution is approximately 100:5:5.

15. The method for fabricating a flexible micro-system of claim 1, wherein a pair of coplanar waveguides are formed by the first conductive structure on the flexible substrate, wherein pressing the second conductive structure to the first conductive structure electrically interconnects the coplanar waveguides.

* * * * *